(12) United States Patent
Tuominen et al.

(10) Patent No.: US 11,688,668 B2
(45) Date of Patent: Jun. 27, 2023

(54) COMPONENT CARRIER WITH LOW SHRINKAGE DIELECTRIC MATERIAL

(71) Applicant: AT&S (China) Co. Ltd., Shanghai (CN)

(72) Inventors: Mikael Tuominen, Pernio (FI); Seok Kim Tay, Singapore (SG)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/949,503

(22) Filed: Oct. 30, 2020

(65) Prior Publication Data

US 2021/0202355 A1 Jul. 1, 2021

(30) Foreign Application Priority Data

Dec. 31, 2019 (CN) .......................... 201922496823.9

(51) Int. Cl.
*H05K 1/02* (2006.01)
*H01L 23/485* (2006.01)
(Continued)

(52) U.S. Cl.
CPC ............ *H01L 23/485* (2013.01); *H01L 23/29* (2013.01); *H01L 23/481* (2013.01); *H05K 1/0298* (2013.01); *H05K 1/0353* (2013.01); *H05K 1/09* (2013.01); *H05K 3/0058* (2013.01); *H01L 23/3114* (2013.01); *H05K 7/023* (2013.01)

(58) Field of Classification Search
CPC ..... H01L 23/485; H01L 23/29; H01L 23/481; H01L 23/3114; H01L 23/562; H01L 2221/68345; H01L 2221/68359; H01L 21/6835; H01L 23/49816; H01L 21/4853; H01L 23/49838; H01L 23/50; H05K 1/0298; H05K 1/0353; H05K 1/09;
(Continued)

(56) References Cited

U.S. PATENT DOCUMENTS 6,611,064 B1 * 8/2003 Kousaka ................. H01L 24/29
257/781
7,183,135 B2 2/2007 Ogawa et al.
(Continued)

FOREIGN PATENT DOCUMENTS

CN 105828529 A 8/2016
CN 106349461 A 1/2017
(Continued)

OTHER PUBLICATIONS

Office Action issued in Application No. 202011405746.2; pp. 1-6; dated May 19, 2022; China National Intellectual Property Administration, No. 6, Xitucheng Lu, Jimenqiao Haidian District, Beijing City, 100088, China.
(Continued)

*Primary Examiner* — Steven T Sawyer
(74) *Attorney, Agent, or Firm* — Robert A. Blaha; Smith Tempel Blaha LLC

(57) ABSTRACT

A component carrier includes a stack having at least one electrically conductive layer structure and/or at least one electrically insulating layer structure. At least part of the at least one electrically insulating layer structure comprises or consists of a material having a curing shrinkage value of less than 2%.

20 Claims, 3 Drawing Sheets

(51) Int. Cl.
    *H05K 1/09*     (2006.01)
    *H05K 1/03*     (2006.01)
    *H01L 23/29*     (2006.01)
    *H01L 23/48*     (2006.01)
    *H05K 3/00*     (2006.01)
    *H01L 23/31*     (2006.01)
    *H05K 7/02*     (2006.01)

(58) Field of Classification Search
    CPC .... H05K 3/0058; H05K 7/023; H05K 3/4626; H05K 1/0271; H05K 3/4697; H05K 1/185
    See application file for complete search history.

(56) References Cited

U.S. PATENT DOCUMENTS

| | | | |
|---|---|---|---|
| 10,276,467 B2 | 4/2019 | Kim et al. | |
| 2005/0037535 A1 | 2/2005 | Takahiko et al. | |
| 2010/0263919 A1* | 10/2010 | Lee | C23C 18/1612 |
| | | | 174/257 |
| 2014/0192501 A1* | 7/2014 | Kotake | C08G 73/106 |
| | | | 524/588 |
| 2014/0216800 A1* | 8/2014 | Zanma | H05K 1/185 |
| | | | 174/258 |
| 2016/0219711 A1* | 7/2016 | Lee | H05K 1/0271 |
| 2016/0338195 A1 | 11/2016 | Ikeda | |
| 2017/0018473 A1* | 1/2017 | Kwon | C07F 7/07 |
| 2017/0278766 A1 | 9/2017 | Kim et al. | |
| 2018/0168031 A1* | 6/2018 | Matsumoto | H05K 3/284 |
| 2018/0186925 A1 | 7/2018 | Sumita et al. | |
| 2019/0274529 A1* | 9/2019 | Suyama | A61B 1/00114 |

FOREIGN PATENT DOCUMENTS

| | | |
|---|---|---|
| EP | 1 519 414 A1 | 3/2005 |
| WO | 2004006331 A1 | 1/2004 |

OTHER PUBLICATIONS

English Translation of cover pages of Office Action issued in Application No. 202011405746.2; pp. 1-3; dated May 19, 2022; China National Intellectual Property Administration, No. 6, Xitucheng Lu, Jimenqiao Haidian District, Beijing City, 100088, China.

* cited by examiner

COMPONENT CARRIER WITH LOW SHRINKAGE DIELECTRIC MATERIAL

TECHNICAL FIELD

The invention relates to a component carrier and to a method of manufacturing a component carrier.

Technological Background

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

A shortcoming with laminated component carriers is that they may be prone to warpage.

SUMMARY

There may be a need to provide a component carrier showing a low tendency of warpage.

According to an exemplary embodiment of the invention, a component carrier is provided which comprises a stack comprising at least one electrically conductive layer structure and/or at least one electrically insulating layer structure, wherein at least part of the at least one electrically insulating layer structure comprises or consists of a material having a curing shrinkage value of less than 2%.

According to another exemplary embodiment of the invention, a method of manufacturing a component carrier is provided, wherein the method comprises providing, in particular laminating, a stack comprising at least one electrically conductive layer structure and/or at least one electrically insulating layer structure, and providing at least part of the at least one electrically insulating layer structure of a material having a curing shrinkage value of less than 2%.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "curing shrinkage value" may particularly denote a ratio between, on the one hand, a difference between a dimension (in particular a length) of a (in particular layer-type) material in an uncured condition and a dimension (in particular a length) of the material in a cured condition, and, on the other hand, said dimension in the uncured condition. Thus, the curing shrinkage value may be in particular indicative of a length reduction of said dielectric material upon curing. The material may comprise a resin (in particular an organic resin such as epoxy resin) which may initially, i.e. before lamination to the layer stack, be in an uncured condition. This means that the material in the uncured condition may still be capable of being laminated by the application of pressure and/or heat. During lamination, the uncured material may become flowable, may start cross-linking or polymerization, and may then be re-solidified at the end of the curing procedure in a cured condition. Curing may thus relate to the curing during lamination of said material.

According to an exemplary embodiment of the invention, a component carrier (such as a printed circuit board) is provided having a preferably laminated (i.e. connected by pressure and/or heat) layer stack which includes a dielectric material with a low curing shrinkage value of less than 2%. Thus, the relative length reduction of said material upon curing may be less than 0.02. Highly advantageously, the behavior of said material to shrink only in a very moderate way by curing during lamination of the stack has turned out to significantly reduce warpage of the stack on panel level as well as of the readily manufactured component carrier. Conventionally, warpage may result in an undesired bending of the plate-shaped component carrier, which may cause secondary problems such as inaccuracies of constituents of the component carrier structure, a tendency of delamination and the presence of stress. It is believed that the inclusion of the low curing shrinkage dielectric in the layer stack keeps lamination-caused interior bonding forces small which may result conventionally in warpage. Suppressing or even completely eliminating the tendency of the component carrier to warp may significantly improve reliability of the component carrier. Since shrinkage of resin material during curing involves stress, it is considered as a significant source of warpage. By reducing shrinkage and therefore material migration and stress creation during curing, also warpage may be reduced.

In the following, further exemplary embodiments of the method and the component carrier will be explained.

In an embodiment, the low shrinkage material may be a curable resin composition comprising at least one polyol selected from the group consisting of polybutadiene polyol, polybutadiene polyol or polyester polyol, and at least one polyblock isocyanate (such as polybutadiene polyblock isocyanate). Such resin materials show a low shrinkage behavior upon curing. Implementing such a material as a laminate in a laminated stack of a component carrier may strongly suppress warpage of the multi-layer component carrier, such as a printed circuit board. In an embodiment, the low shrinkage material may be GX92™ available from the company Ajinomoto of Tokyo, Japan.

The component carrier may be a rigid component carrier with low warpage behavior.

In an embodiment, the curing shrinkage value is less than 1.5%, in particular less than 1%, more particularly less than 0.5%, preferably less than 0.2%. With such low values of the curing shrinkage value, excellent properties in terms of warpage-protection can be obtained.

In an embodiment, said low curing shrinkage material has a value of the Young modulus above 8 GPa. The value may be even above 12 GPa. In the context of the present application, the term "Young modulus" may particularly denote the elastic modulus, i.e. a measure of the stiffness of a solid material and defines the relationship between stress (force per unit area) and strain (proportional deformation) in a material. A softer material has a smaller value of the Young modulus than a more rigid material. Highly advantageously, it has turned out that said material having a low shrinkage behavior does not necessarily have to be a low Young modulus material. Thus, said material does not have to be soft, but may contribute to the rigidity of the component carrier. Moreover, the fact that a low Young modulus property of said low curing shrinkage material is dispensable, the effort connected with the provision of the low curing shrinkage dielectric is small. This allows manufacturing the component carrier in a simple and efficient way.

In another embodiment, said low curing shrinkage material has a value of the Young modulus below 8 GPa, in particular below 3 GPa, more particularly below 1 GPa. Such a material may serve as a mechanical buffer structure, i.e. as a mechanically relatively flexible or elastic electrically insulating structure. This may render said material highly appropriate for (in particular directly) surrounding an embedded component of the component carrier. Such a mechanical buffer structure may have a locally reduced value of the Young modulus and may therefore function as a mechanically damping or force balancing structure, for instance in the event of bending stress. Thus, excellent results may be achieved when combining the low curing shrinkage property of said material with a low Young modulus characteristic thereof.

In an embodiment, said low curing shrinkage material is functionalized. For instance, the functionalization may relate to a high thermal conductivity function, a low loss at high frequency function, and/or a high flow function (i.e. may show a low viscous flowing property upon curing so as to flow in any gaps to avoid undesired voids within a stack, for instance contrary to a low flow prepreg). For instance, such a functionalization may be achieved by adding filler particles to said material with the low shrinkage behavior. Thus, the low shrinkage value dielectric may comprise filler particles so as to adjust the physical properties of the component carrier. For example, such filler particles may at least partially equilibrate a mismatch between the coefficients of thermal expansion of the various materials of the stack (in particular copper and resin, optionally comprising reinforcing particles such as glass fibers). It is also possible that the filler particles are functionalized in another way, for instance to increase the thermal conductivity of the component carrier. The filler particles may also be selected so as to improve the high frequency performance of the component carrier, for instance may be made of a low dk material.

In an embodiment, a core of the stack comprises a material having a low coefficient of thermal expansion (CTE) value, in particular below 15 ppm/K. This may ensure that the component carrier does not create excessive thermal stress in the event of heating, for instance during operation of the component carrier.

In an embodiment, said low curing shrinkage material forms an outer layer (in particular an outermost layer) of the stack. In particular, said low curing shrinkage material may form two opposing outer layers (in particular outermost layers) of the stack. One or both opposing main surfaces of the stack may thus be formed by a low shrinkage value dielectric. Experiments have shown that in particular the outermost layer structures of the stack have a strong impact on the warpage behavior, so that their provision from a low shrinkage value dielectric may have a specifically pronounced impact on warpage suppression.

In an embodiment, the at least one electrically conductive layer structure comprises at least one pad connected to at least one plated via, for instance for externally connecting an embedded electronic component of the component carrier. In particular, a ratio between a diameter of the pad and a maximum diameter of the plated via may be less than 2, preferably less than 1.5. In a preferred embodiment, it may even be possible that the at least one electrically conductive layer structure comprises a landless or padless plated via, i.e. a via which does not require any land or pad for connection with an electrically conductive trace of the component carrier. In view of the low shrinkage behavior of at least part of the dielectric material of the stack and the resulting low warpage behavior, it has turned out that the positional accuracy of the constituents of the component carrier may become so high that tolerance balancing pads for connecting copper filled laser drilled vias may be formed very small or can be even omitted at all. This allows the manufacture of a highly accurate component carrier. This may be advantageous in particular for fine-line applications, i.e. for component carriers having a very small line space ratio (for instance below 5 µm/5 µm).

In an embodiment, the component carrier comprises a component embedded in the stack. In the context of the present application, the term "component" may particularly denote an inlay-type member. Such a component may be arranged in an interior of the stack. A component may in particular have an electronic function and may thus be a heat source in view of ohmic losses. For instance, such a component may be a semiconductor die. Embedding a component, for instance a semiconductor die, in a component carrier stack, which may comprise copper, organic resin and optionally glass particles, may create particularly pronounced warpage issues. It is believed that this results from the very different materials which a component and the stack may have. Thus, the provision of a low curing shrinkage dielectric in the stack may have particularly pronounced advantages in the presence of an embedded component.

In an embodiment, said low curing shrinkage material covers, in particular directly surrounds, at least part of the component. When the low curing shrinkage dielectric is in direct physical contact with the embedded component, excellent properties in terms of warpage protection can be obtained in particular at the critical interface between component and stack.

In an embodiment, said low curing shrinkage material has a shell surrounding at least part of the component and has two opposing layers sandwiching the component and the surrounding shell and extending laterally beyond all sidewalls of the component. Said shell may partially or entirely surround the component laterally, i.e. at its sidewalls, and/or vertically, i.e. at one or both horizontal surfaces of the embedded component. Such a shell with its direct impact on the embedded component may be synergistically combined with laterally extended outer layers enclosing component and shell. This geometry has turned out to be particularly appropriate for obtaining a strong warpage suppression.

In an embodiment, at least part of said low curing shrinkage material (i.e. only part of the low curing shrinkage material or the entire low curing shrinkage material) is spaced with regard to the component by another material, in particular another dielectric material. Thus, it is also possible that another dielectric material is arranged between the embedded component and the material with the low curing shrinkage value. In such an embodiment, the physical properties of the direct environment of the embedded component may be specifically adjusted by a corresponding selection of the other dielectric material.

In an embodiment, said other material has a value of the Young modulus below 8 GPa, in particular below 3 GPa, more particularly below 1 GPa. Descriptively speaking, when embodying the other material as a low Young modulus material, the other material surrounding the embedded component may serve as a soft mechanical buffer to thereby protect the embedded component and the surrounding stack from excessive stress. The synergistic combination of such a low Young modulus material with the aforementioned low curing shrinkage dielectric (in particular when the latter has a value of the Young modulus of above 8 GPa, in particular above 12 GPa) may allow to obtain a particularly high reliability of the obtained component carrier structure.

In an embodiment, the other material directly surrounds the component. By establishing a direct physical contact between the embedded component and said other material, the influence of the other material on the embedded component may be made particularly high.

In an embodiment, the other material has a curing shrinkage value of more than 1%, in particular more than 2%. Advantageously, it is sufficient to configure the other material with a relatively high curing shrinkage value, since the low curing shrinkage value of the material may be sufficient for suppressing warpage of the overall component carrier in an efficient manner. At the same time, the material properties of the other material may be freely selected for optimizing the overall behavior of the component carrier. Since it may be dispensable to configure the other material of low curing shrinkage material, the other material may be provided with reasonable effort.

For instance, the other material may have a curing shrinkage value of more than 1% (while a maximum value of below 2% shrinkage may be used for the first material). Hence, the first material may have a shrinkage of below 2%, whereas the other material may have a shrinkage of above 1%. Possible variants are in particular that said first material has a shrinkage value of 0.5%, and said other material has a shrinkage value of 1.5%, or that said first material has a shrinkage value of 1.1%, whereas said other material has a shrinkage value of 2.3%.

In an embodiment, the low curing shrinkage material forms two opposing outer layers of the stack with the component and the other material in between. An exterior portion of the dielectric stack material may thus be configured for warpage suppression, whereas an interior portion of the dielectric stack material may be adapted for protecting the enclosed component.

In an embodiment, said other material has a shell surrounding at least part of the component and has one or two opposing layers extending laterally beyond all sidewalls of the component. This may allow adjusting the environment of the embedded component specifically advantageously while simultaneously ensuring a proper warpage suppression.

In an embodiment, the ratio between a length of the embedded component (in particular a semiconductor chip) and a length of the component carrier (for example a printed circuit board) is at least 30%, in particular at least 40%. In particular in the event of the mentioned high die-to-board ratios, issues with warpage of a component carrier with embedded component are particularly pronounced. Thus, the provision of a low curing shrink-age dielectric material is of utmost advantage in such a scenario.

In an embodiment, the at least one electrically insulating layer structure comprises another material having different physical properties than said low curing shrinkage material and being in direct physical contact with said low curing shrinkage material. Thus, different dielectric materials with different properties (for instance different properties in terms of curing shrinkage value, value of the Young modulus, value of the coefficient of thermal expansion, value of the thermal conductivity, flowability during curing, etc.) may be directly connected with each other, for instance may be pressed together during lamination.

In an embodiment, the curing shrinkage value of said material is measured by connecting a layer of said low curing shrinkage material in an uncured condition and with an initial length "A" on a base, curing said layer, determining a length "a" of the cured layer in a cured condition of said low curing shrinkage material, and calculating the curing shrinkage value as: $(A-a)/A$.

It goes without saying that the curing shrinkage value of any other material may be determined in the same way.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, at least one of the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multi-layer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular copper or other materials coated with supraconductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF THE ILLUSTRATED EMBODIMENTS

Figure 1:
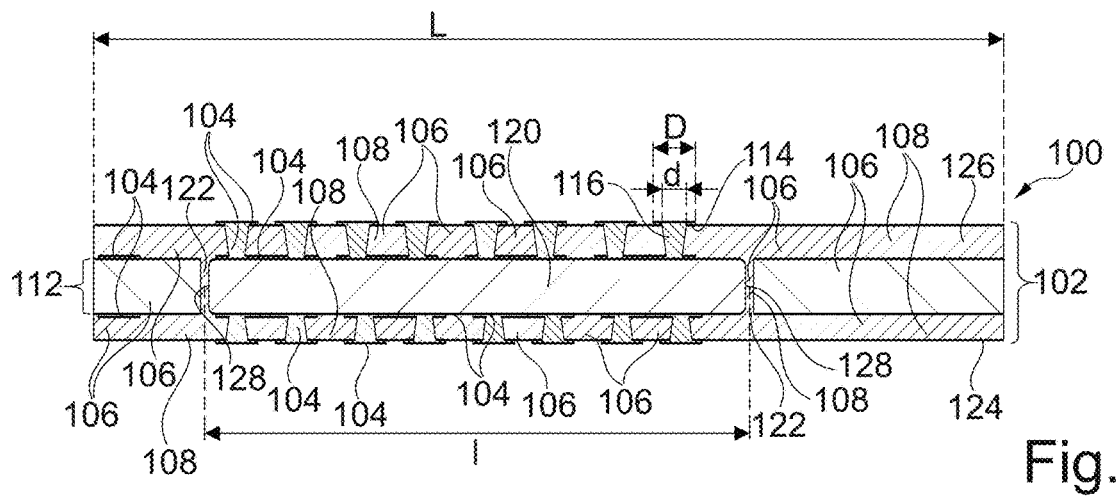
FIG. 1 illustrates a cross-sectional view of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to exemplary embodiments of the invention, a laminate-type component carrier with low curing shrinkage dielectric is provided for suppressing warpage of the component carrier (for instance a printed circuit board, PCB). In particular, an exemplary embodiment of the invention provides an electronic component packaging concept based on the lamination of low shrinkage material in a layer stack.

In particular embedding technology is continuously facing issues with the warpage performance of a manufactured component carrier. To counter these type of issues, exemplary embodiments of the invention may use a dedicated type of materials to reduce the warpage and enable lower warpage performance packaging. An embodiment of the invention relates to a scenario in which the electronic component(s) is/are embedded into a PCB package system completely or partially by utilizing low shrinkage materials. When special (in particular dielectric) materials with shrinkage value below 2% are used for the embedded packaging, this results in a reduced warpage on a package level.

A gist of an exemplary embodiment of the invention is to provide a technology concept for packaging embedding applications enabling to reach a stable technology for exceedingly high die-to-package ratio component carriers. Particularly pronounced advantages may be achieved in terms of fan-out packaging. Exemplary embodiments of the invention allow to significantly improve reliability of component carriers by identifying the shrinkage value of dielectric stack material as a critical parameter for warpage suppression.

More specifically, a dielectric stack material with a low curing shrinkage value of less than 0.5% may be preferred. Highly preferred may be materials with shrinkage value below 0.2%.

Exemplary embodiments of the invention may be carried out in particular using any appropriate embedding technology, such as center-core embedding.

It may be in particular advantageous to provide a low shrinkage material specifically for an encapsulation layer encapsulating a component and/or for one or more additional build-up layers of the stack. As an alternative, it is also possible to provide the whole dielectric material of the stack of low shrinkage materials. In particular, shrinkage may denote the curing shrinkage of the material, in particular a resin thereof.

Hence, an exemplary embodiment of the invention identifies curing shrinkage behavior of dielectric stack material as a critical parameter for the total warpage control of a (in particular package-type) component carrier. The provision of a low shrinkage material in a dielectric stack may allow to improve the warpage performance of the component carrier, in particular when equipped with an embedded component.

FIG. 1 illustrates a cross-sectional view of a component carrier 100 according to an exemplary embodiment of the invention.

According to FIG. 1, the laminate-type component carrier 100 is provided which may be configured as a plate-shaped PCB (printed circuit board) or IC (integrated circuit) substrate. The component carrier 100 comprises a laminated stack 102 comprising electrically conductive layer structures 104 and electrically insulating layer structures 106. Lamination may particularly denote the connection of the layer structures 104, 106 by the application of pressure and/or heat. For example, the electrically conductive layer structures 104 may comprise patterned copper foils and vertical through-connections, for example copper filled laser vias. The electrically insulating layer structures 106 may comprise a respective resin (such as a respective epoxy resin), optionally comprising reinforcing particles therein (for instance glass fibers or glass spheres). For instance, a part of the electrically insulating layer structures 106 (with the exception of material 108, as described below) may be made of prepreg or FR4.

In the component carrier 100, a part of the electrically insulating layer structures 106 is made of a material 108 having a curing shrinkage value of less than 0.5%. This means that a length, L, of the layer-shaped material 108 may be reduced by less than 0.5% during curing while being laminated on the stack 102. Details will be described below referring to FIG. 2 to FIG. 6. In particular, such a curing shrinkage value may be adjusted by correspondingly setting the properties of the resin of material 108. For instance, the low shrinkage material may be ABF® material GX92™ available from the company Ajinomoto®. ABF and Ajinomoto are registered marks of Ajinomoto Co., Inc., Kyobashi 1-chome Chuo-ku, Tokyo, Japan. When laminating stack 102 by the application of heat and/or pressure, the low shrinkage material 108 will undergo curing which reduces the length, L, of the material 108 by less than 0.5% (compare FIG. 2 to FIG. 6 illustrating a process of measuring curing shrinkage). This has the advantage that the readily manufactured component carrier's 100 tendency of showing warpage can be significantly reduced.

Further advantageously, said low curing shrinkage material 108 may have a value of the Young modulus above 8 GPa, i.e. the shrinkage material may be relatively rigid. This promotes rigidity of the component carrier 100 as a whole. In view of its low curing shrinkage behavior, it is thus not necessary (although possible in other embodiments) that material 108 additionally shows a low Young modulus behavior. It is believed that the strong suppression of warpage renders it dispensable to provide a specifically soft material in the stack 102.

Alternatively, said low curing shrinkage material 108 may have a value of the Young modulus of not more than 5 GPa, i.e. the shrinkage material may be relatively soft. In such an embodiment the low curing shrinkage material 108 may function as a mechanical buffer, in particular protecting an embedded component 120 described below.

A central core 112 of the stack 102 comprises a fully cured dielectric (such as FR4). On both opposing main surfaces of the fully cured dielectric, a respective patterned copper layer may be provided as electrically conductive layer structure 104. In an embodiment, it is possible that the core 112 is provided with a material having a low coefficient of thermal expansion (CTE) value of less than 15 ppm/K. This may reduce thermal stress in an interior of stack 102 when heating or cooling the component carrier 100.

In the shown embodiment, the low curing shrinkage material 108 forms two opposing outer layers of the stack 102 sandwiching core 112 and embedded component 120. More specifically, the low curing shrinkage material 108 circumferentially surrounds embedded component 120 as a shell 122.

The component 120 is embedded in the stack 102 and is circumferentially completely surrounded by the low curing shrinkage material 108 as well as of material of the electrically conductive layer structures 104 providing an exterior electrical access to the embedded component 120. For example, the embedded component 120 is a semiconductor chip. As shown, the low curing shrinkage material 108 directly surrounds the component 120, so that the dielectric low curing shrinkage material 108 is in physical contact with the embedded component 120. As already mentioned, said low curing shrinkage material 108 has shell 122 surrounding the component 120 and has two opposing layers 124, 126 sandwiching the component 120 and the surrounding shell 122 and extending laterally beyond all sidewalls 128 of the component 120, for instance up to the exterior edges of the component carrier 100. The embedding of the component 120 within low curing shrinkage dielectric significantly contributes to the warpage suppression of the component carrier 100 shown in FIG. 1.

As shown in FIG. 1 as well, a ratio between a length, l, of the embedded component 120 and a length L of the component carrier 100 may be more than 50%. Thus, component carrier 100 has a high die-to-package ratio and is thus particular prone to warpage. Thanks to the low curing shrinkage material 108, the tendency of the component carrier 102 to warp may be significantly reduced.

Due to the efficient suppression of warpage, the mechanical reliability of the component carrier 100 as well as the accuracy of the positioning of the various constituents thereof (in particular of the electrically conductive layer structures 104 and their substructures) may be high. As shown, the electrically conductive layer structures 104 comprise copper pads 114 each connected to a respective copper plated via 116. A respective pad 114 has a larger size or diameter, D, than the maximum size or diameter, d, of the via 116 to balance out tolerances and inaccuracies (for instance when an electrically conductive trace, not shown in FIG. 1, is to be connected to pad 114). More specifically, a ratio between diameter, D, of a respective pad 114 and maximum diameter, d, of an assigned plated via 116 may be less than 2. This small pad size, which may result in a compact configuration of the component carrier 100, is a consequence of the high positional accuracy of the substructures of the electrically conductive layer structure 104 thanks to the strong warpage suppression caused by low curing shrinkage material 108.

Although not shown explicitly, it may be possible that the component carrier 100 according to FIG. 1 has an electrically conductive layer structure 104 which comprises a landless plated via 116, i.e. a via 116 having no pad at all (for instance being directly connected to an electrically conductive trace, not shown, without pad). In view of the significantly improved registration accuracy due to the strong suppression of warpage, small pad sizes or even padless configurations may be made possible.

The embodiment of FIG. 1 shows embedded component 120 being substantially completely encapsulated within low shrinkage material 108 at a top side, a bottom side and being surrounded also along sidewalls 128. This ensures a particularly strong suppression of warpage.

FIG. 2 to FIG. 6 illustrate cross-sectional views of structures obtained during carrying out a method of determining a curing shrinkage value of an electrically insulating layer structure 106, in particular of the above-described material 108, to be used for manufacturing a component carrier 100 according to exemplary embodiments of the invention. Thus, it will be described in the following referring to FIG. 2 to FIG. 6 how the curing shrinkage value (0.5% according to material 108 of FIG. 1) can be measured.

Figure 2:
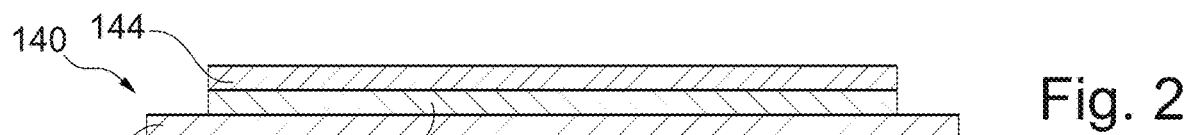
FIG. 2, FIG. 3, FIG. 4, FIG. 5 and FIG. 6 illustrate cross-sectional views of structures obtained during carrying out a method of determining a curing shrinkage value of an electrically insulating layer structure to be used for manufacturing a component carrier according to an exemplary embodiment of the invention.

Referring to FIG. 2, a (for instance laminated) layer stack 140 is shown which is composed of a bottom layer 142 (for instance made of polyimide, PI) covered by an uncured layer of material 108' (which will be converted into above-described material 108 during curing) being covered, in turn, by a protection layer 144 (for instance polyethylene terephthalate, PET).

Figure 3:
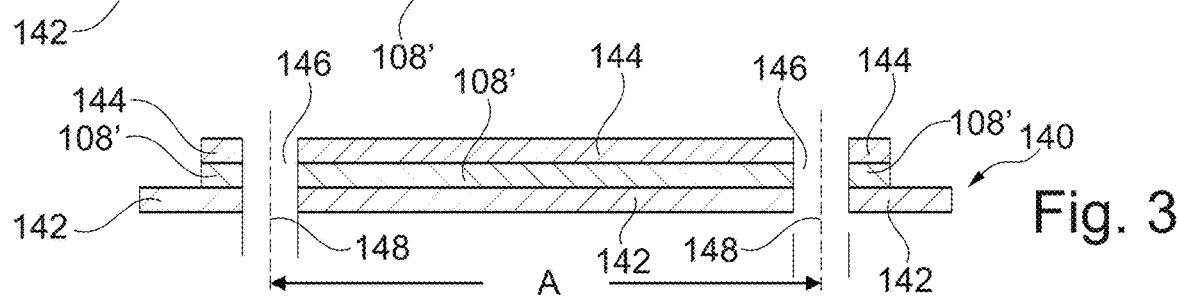

Referring to FIG. 3, holes 146 may be formed in the layer stack 140 to thereby delimit in between a planar portion of the layer stack 140 with defined initial length "A". Length "A" of uncured material 108' is measured between centers 148 of the holes 146.

Figure 4:
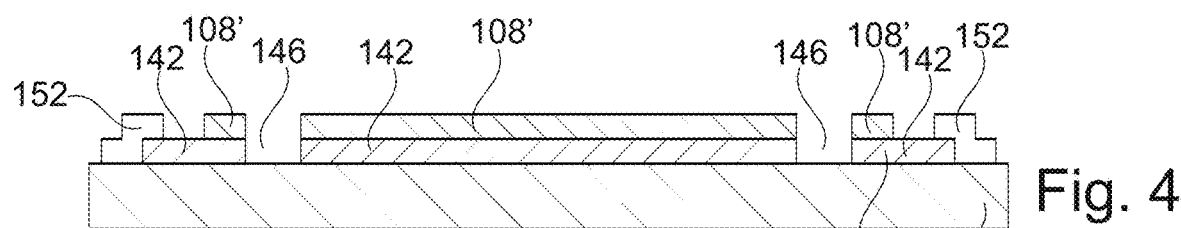

Referring to FIG. 4, the layer of said material 108' of said initial length "A" is attached to a plate-type base 150 in an uncured condition with bottom layer 142 in between. In other words, the uncured material 108' is set on base 150, which may be embodied as a temporary carrier structure or back board, and is fixed there. Protection layer 144 may be removed from layer stack 140, for instance by peeling it off. Edge portions of the layers 142, 108' outside of the holes 146 may be fixed with a fixing structure 152, for instance polyimide tape (which may be adhesive).

Figure 5:
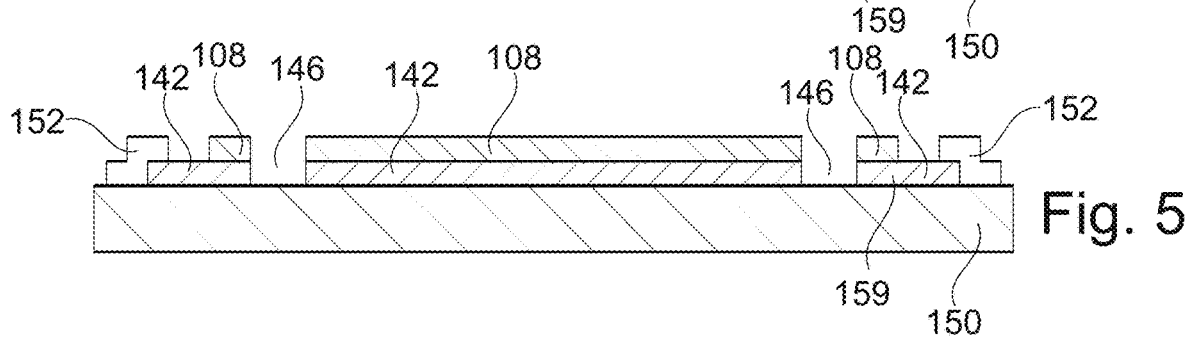

Referring to FIG. 5, the arrangement shown in FIG. 4 and in particular material 108' is then cured, for instance by applying heat and/or pressure. Thereby, a lamination procedure may be carried out or simulated. During curing, the length of uncured material 108' is reduced by shrinking to thereby obtain cured material 108.

Figure 6:
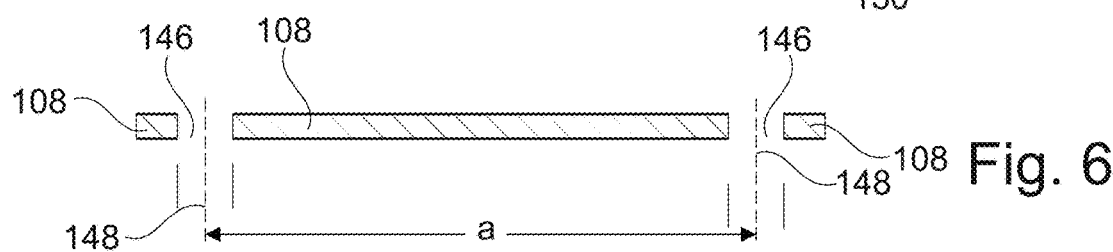

Referring to FIG. 6, a cured length "a" of said material 108 (i.e. obtained by curing material 108') is determined in a cured condition. For this purpose, the layer which is being converted from uncured material 108' to cured material 108 by curing is removed from the base 150 and from the bottom layer 142. Then, the distance between the centers 148 is remeasured after curing. Due to slight shrinkage during curing, a<A. After having determined cured length "a", the curing shrinkage value may be calculated based on the formula (A−a)/A.

Figure 7:
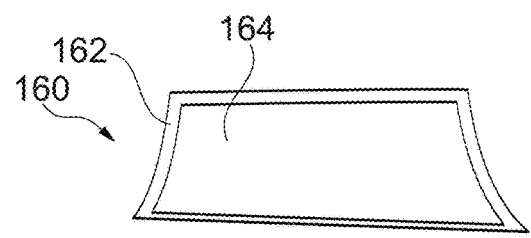
FIG. 7 is an image of a conventional panel used for manufacturing component carriers and showing significant warpage.
Figure 8:
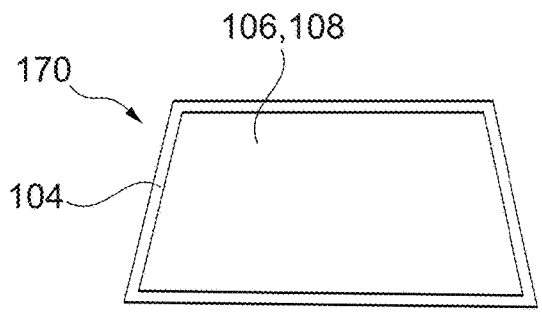
FIG. 8 is an image of a panel having a dielectric material with a low curing shrinkage value used for manufacturing component carriers according to an exemplary embodiment of the invention and showing strongly suppressed warpage.

Reference data shown in FIG. 7 and FIG. 8 have been derived from runs in a production line with different shrinkage factor materials.

FIG. 7 is an image 160 of a conventional panel having an electrically conductive layer structure 162 and an electrically insulating layer structure 164 thereon. As shown, said panel being conventionally used for manufacturing component carriers shows significant warpage. The dielectric material used for the panel according to FIG. 7 has a value of the Young modulus of 4 GPa. It shows a pronounced warpage of 44 mm.

FIG. 8 is an image 170 of a panel having a dielectric material 108 with a low curing shrinkage value used for manufacturing component carriers 100 according to an exemplary embodiment of the invention and showing strongly suppressed warpage.

The dielectric material used for the panel according to FIG. 8 has a value of the Young modulus of 10 GPa. It shows zero warpage thanks to the use of the dielectric material 108 with low curing shrinkage value of less than 2%. Highly advantageously, dielectric material of the component carrier 100 according to an exemplary embodiment of the invention may have even a higher value of the Young modulus, so that the effort of providing this material 108 is even lower than conventionally. At the same time, the warpage behavior is significantly improved. The material 108 with larger Young modulus value but with much improved shrinkage performance provides a highly advantageous warpage performance.

Figure 9:
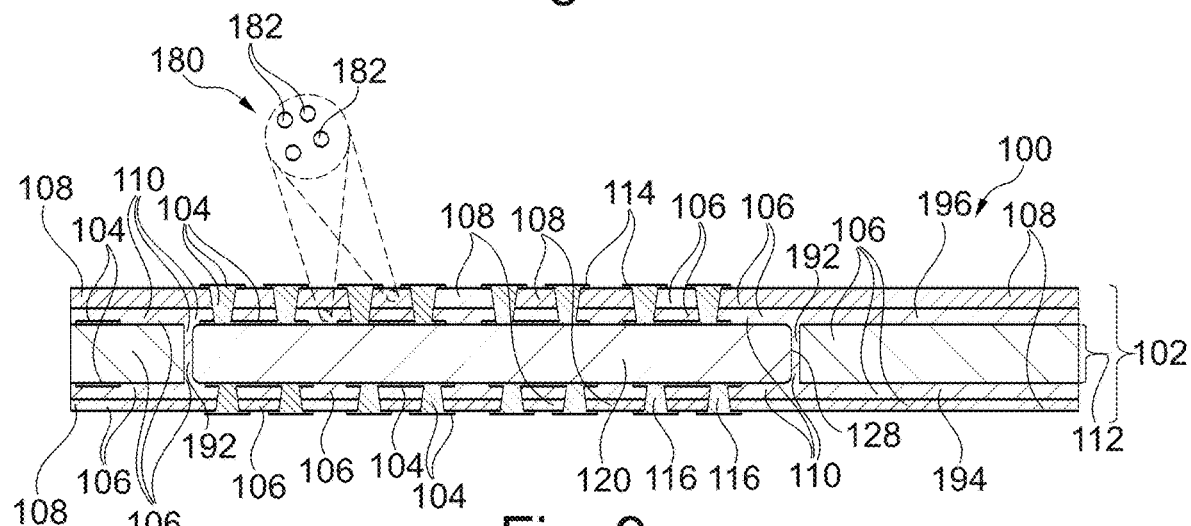
FIG. 9 and FIG. 10 illustrate cross-sectional views of component carriers according to other exemplary embodiments of the invention.

FIG. 9 illustrates a cross-sectional view of a component carrier 100 according to another exemplary embodiment of the invention.

According to FIG. 9, the high Young modulus low curing shrinkage material 108 is spaced with regard to the embedded component 120 by another dielectric material 110. Said other material 110 may advantageously have a low value of the Young modulus, for instance below 1 GPa. Thus, the other dielectric material 110 may function as a soft mechanical buffer for protecting the embedded component 120. As shown in FIG. 9, said other material 110 directly surrounds the component 120 with physical contact. The other material 110 may have a relatively large curing shrinkage value of for instance more than 2%. Since low curing shrinkage material 108 provides for a low warpage configuration of component carrier 100, other material 110 does not need to fulfill this material property. This increases the freedom of selecting the other material 110.

As shown in FIG. 9, the low curing shrinkage material 108 forms two exterior opposing layers of the stack 102 with the component 120 and the other material 110 in between. The low curing shrinkage material 108 forms outermost layers of the stack 102.

In this embodiment, component 120 may be embedded in a through hole extending through core 112. Thereafter, component 120 may be glued in place by laminating organic dielectric material 110. Thereby, upper and lower main surfaces as well as sidewalls 128 of component 120 may be surrounded by cured other material 110. As shown, said other material 110 has a shell 192 directly surrounding the component 120 and two opposing layers 194, 196 sandwiching the component 120 and the shell 192 and extending laterally beyond all sidewalls 128 of the component 120.

As shown in a detail 180 in FIG. 9, said material 108 and/or said other material 110 may be functionalized, for example by adding corresponding filler particles 182 with desired physical properties. For instance, such filler particles 182 may provide the material 108 and/or the other material 110 with a high thermal conductivity, a low loss at high signal frequency, and/or high flow properties during lamination.

Advantageously, the embodiment of FIG. 9 combines material 108 (providing a high mechanical board strength in view of its high Young modulus and low shrinkage properties) with the other material 110 (providing an encapsulation with low Young modulus material).

FIG. 9 also shows different electrically insulating layer structures 106, i.e. in particular first-layer structures relating to said material 108 and second-layer structures relating to said other material 110. As described above, the material 108 and the other material 110 have different physical properties and are nevertheless in direct physical contact with each other. More specifically, the electrically insulating layer structures 106 relating to material 108 and the other electrically insulating layer structures 106 relating to the other material 110 may be pressed together with direct physical contact and/or may be thermally interconnected during lamination.

Figure 10:
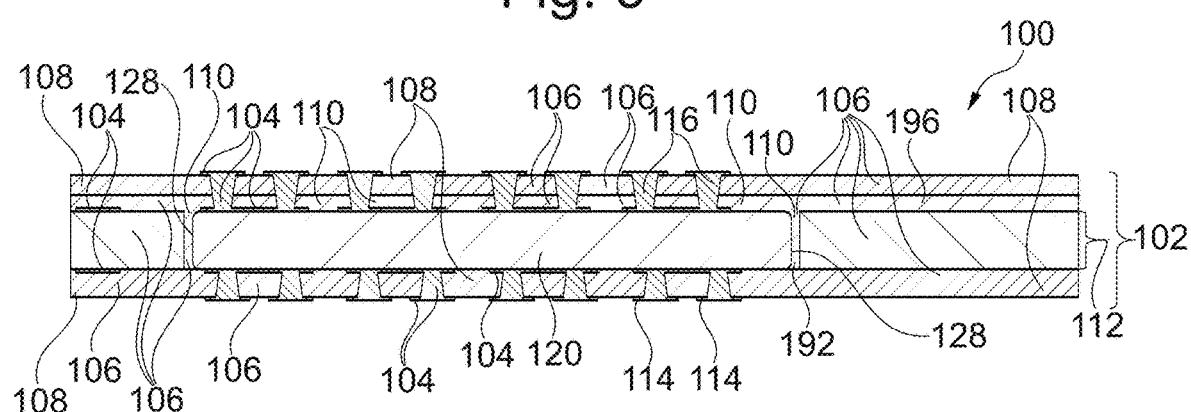

FIG. 10 illustrates a cross-sectional view of a component carrier 100 according to still another exemplary embodiment of the invention.

The embodiment of FIG. 10 differs from the embodiment of FIG. 9 in that, according to FIG. 10, the other material 110 only surrounds sidewalls 128 and an upper main surface of the embedded component 120. More specifically, said other material 110 has a shell 192 surrounding only part of the component 120 and has one layer 196 extending laterally beyond all sidewalls 128 of the component 120 up to the lateral edges of the component carrier 100. According to FIG. 10, a lower main surface of the embedded component 120 is in direct physical contact with material 108.

Figure 11:
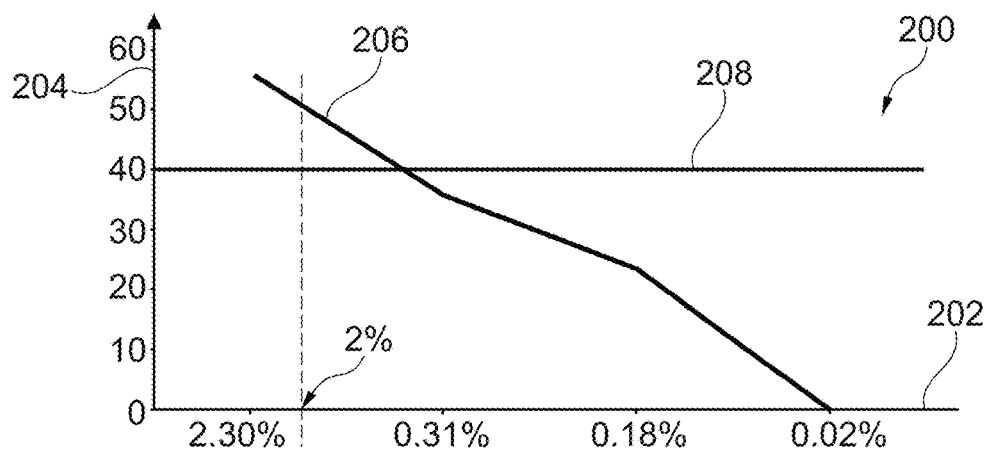
FIG. 11 shows a dependency between a curing shrinkage value and warpage obtained from experimental measurements of component carrier structures.

FIG. 11 shows a diagram 200 illustrating a dependency between a curing shrinkage value (plotted in percent along an abscissa 202) and warpage (plotted in millimeters along an ordinate 204) obtained from experimental measurements of component carrier structures. FIG. 11 also indicates a test specification of 40 mm. For this experiment, uncured electrically insulating layers with different shrinkage properties have been applied on a respective copper layer, and were subsequently cured. Warpage of each respective electrically insulating layer structure has then been measured by comparing the dimensions before and after curing. As shown, warpage can be significantly reduced by using low-shrinkage material, in particular with a curing shrinkage value of less than 2%. A curing shrinkage value above about 2% may result in excessive warpage.

Hence, the experiments according to FIG. 11 show that a curing shrinkage value of less than 2% may significantly reduce the occurrence of warpage. With respect to the simulation described referring to FIG. 12 below, a very similar trend was found.

Figure 12:
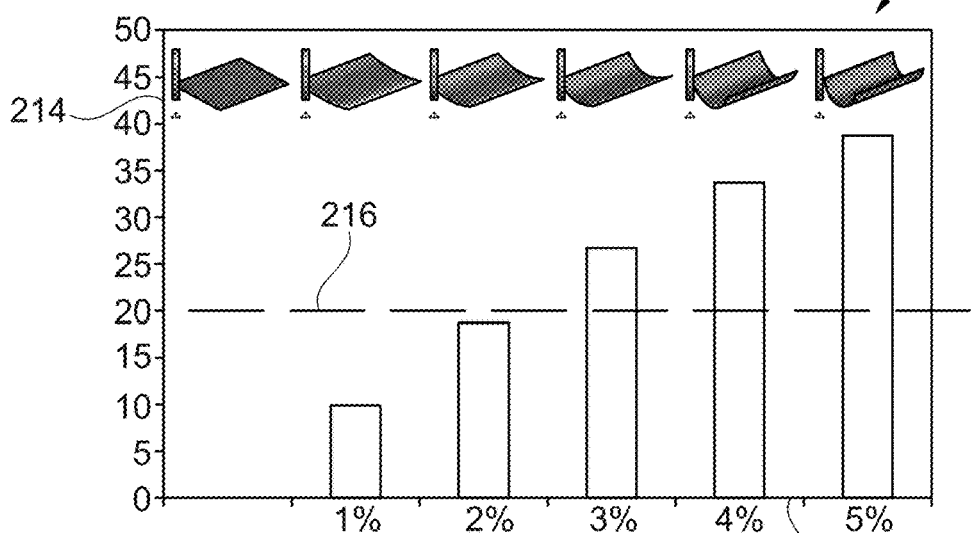
FIG. 12 shows a dependency between a curing shrinkage value and warpage obtained from a simulation of component carrier structures.

FIG. 12 shows a diagram 210 illustrating a dependency between a curing shrinkage value (plotted in percent along an abscissa 212) and warpage (plotted in millimeters along an ordinate 214) obtained from a simulation of component carrier structures using the simulation software ABAQUS 2019. For this simulation, component carrier structures similar to the above description referring to FIG. 11 have been simulated. More specifically, different resin-based electrically insulating layer structures with different shrinkage values with a thickness of 40 μm and horizontal dimensions of 150 mm×110 mm have been simulated on a copper layer with a thickness of 35 μm and horizontal dimensions of 160 mm×120 mm (this may be denoted as a quarter panel simulation approach). The simulation included heating the respective component carrier structure up to a lamination temperature of 170° C. followed by a subsequent cooling down to room temperature. The result of this simulation is plotted in FIG. 12 and confirms that warpage (as indicated by the vertical bending of the component carrier structures shown in FIG. 12) can be significantly reduced by using low-shrinkage material 108, in particular with a curing shrinkage value of less than 2%. As can be taken from FIG. 12, compliance with a benchmark value 216 of about 20 mm warpage (for the simulated panel dimensions 160 mm×120 mm/150 mm×110 mm) could be achieved for the simulations with a shrinkage value of less than about 2%. The quantitative measure of warpage according to FIG. 12 is the extension of the component carrier structure in vertical direction.

Both the experiment and the simulation show that with increasing shrinkage, warpage will increase. The extent of warpage increase from a curing shrinkage value of 1% to 2% is pronounced, whereas the extent of increased warpage continuously decreases slightly with increasing curing shrinkage value. Without wishing to be bound to a specific theory, it is presently believed that this is mainly due to a maximum deformability of the copper below the resin. There is a threshold at which the copper cannot further bend significantly.

As shown consistently by FIG. 11 and FIG. 12, an acceptable amount of warpage corresponds to a curing shrinkage value of below 2%.

Figure 13:
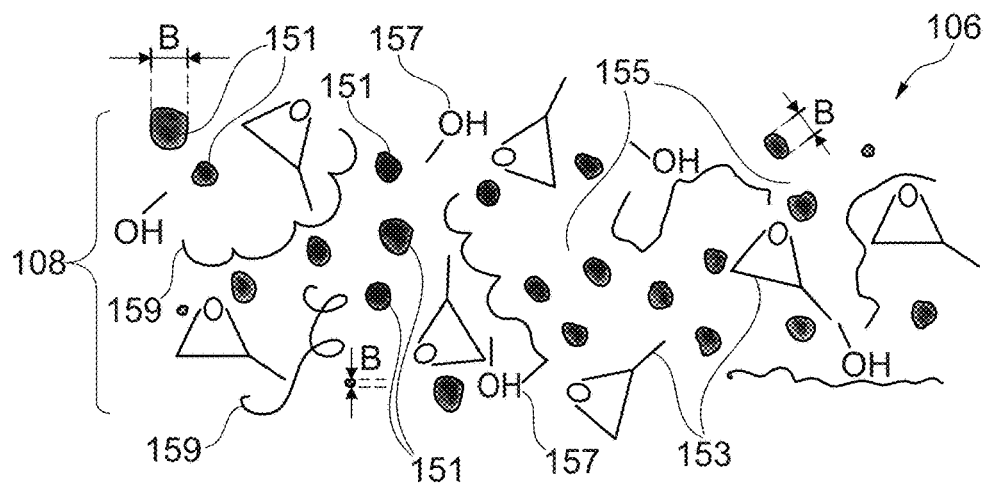
FIG. 13 is an image with a schematic view of an electrically insulating layer structure made of a material with a low curing shrinkage value according to an exemplary embodiment of the invention.

FIG. 13 is an image with a schematic view of an electrically insulating layer structure 106 made of a material 108 with a low curing shrinkage value according to an exemplary embodiment of the invention.

The illustrated low-shrinkage material 108 may comprise a matrix of resin 153, filler particles 151, solvent 155, hardeners 157, and polymers 159. Preferably but not necessarily, said material 108 may be free of reinforcing glass fibers. For example, the resin 153 may be epoxy resin, in particular a mixture of bisphenol A epoxy resin and bisphenol F epoxy resin. The filler particles 151 may be silica spheres or beads. Filler particles 151 may be added for adjusting the function of the material 108, in particular for enhancing its thermal conductivity. As solvent 155, a mixture of different solvent constituents may be used, for instance comprising coal tar naphtha, cyclohexanone, naphthalene, methylethylketone, and toluene. The hardener 157 may be phenol hardener. Moreover, one or more polymers 159 (in particular polymers having phenolic residues) may be added for fine-tuning the functionality of the material 108.

Additionally, one or more reactive substances (not shown) such as 1,6-bis(2,3-epoxypropoxy)naphthalene may be added to the formulation. The latter mentioned substance may react during lamination and may be incorporated within the polymer (resin) network. Furthermore, 1,6-bis(2,3-epoxypropoxy)naphthalene may decrease the overall viscosity of the resin. This reactive substance can make up to 5 weight percent. Said reactive component (in particular a monomer) may polymerize during lamination.

Preferably, the material 108 comprises a relatively high amount of filler particles 151, for instance in the range from 60 to 70 weight percent (generally at least 50 weight percent, in particular at least 60 weight percent) in relation to the overall weight of said material 108. Said filler particles 151 may have an arithmetic average of largest diameters B in a range from 0.25 μm to 1 μm. For instance, 80% or more of the filler particles 151 has a diameter B in a range from 0.2 μm to 4 μm. It is believed that a high amount of filler particles 151 suppresses the shrinkage tendency of the material 108.

Moreover, said material 108 comprises a relatively small amount of less than 10 weight percent resin 153, in relation to the overall weight of said material 108. Descriptively speaking, a low amount of resin 153 keeps hollow spaces in an interior of material 108 small and has therefore a limiting impact on the shrinkage behavior. Preferably, resin 153 is provided in material 108 already initially, i.e. before lamination, with high packing density which additionally limits the possibility for material 108 to shrink significantly during curing because the interior unfilled volumes are small.

Furthermore, said material 108 comprises, in a cured state, less than 1 weight percent solvent 155, in relation to the overall weight of said material 108. It is believed that a low amount of solvent 155 in the cured material 108 keeps interior voids of material 108 small and has therefore also a limiting effect on the tendency to shrink.

Since the amount of solvent 155 can be reduced by curing, the amount of solvent 155 may be higher than 1 weight percent before curing. Preferably, it may be possible to reduce an amount of solvent 165 of said material 108 up to for instance less than 1 weight percent, in relation to the overall weight of said material 108, by an additional preheating treatment before laminating stack 102. It may then be possible to further reduce the amount of solvent 155 of said material 108 by laminating material 108 in stack 102 up to less than preferably 0.05 weight percent in the readily manufactured component carrier 100, in relation to the overall weight of said material 108. Before the reduction process and the lamination process, the amount of solvent 155 of said material 108 may be initially for instance at least 5 weight percent.

A proper selection of the polymers 159 may also contribute to the decreased curing shrinkage. Apart from this, an important reason for the decreased curing shrinkage may be a sufficiently large amount of added filler particles 151. The material 108 used may for instance have a filler content of about 63 weight percent. At least over certain ranges, the coefficient of thermal expansion (CTE) of the formulation may almost linearly decrease with the amount of added filler particles 151. Besides, the resin 153, the hardener 157 and the other polymers 159 may be designed to increase the stacking density of the material 108 to achieve a very tightly packed structure with very low free volume in between. Since material 108 is very tightly packed, it cannot further shrink significantly, as there is no further free volume available.

Furthermore and as already mentioned above, reduction of the solvent content 155 may also have a positive impact on the shrinkage behavior of material 108. Advantageously, the performance and/or reliability of the readily manufactured component carriers 100 may be improved by pre-treating material 108 prior to laminating it to layer stack 102. Said pre-treatment may be specifically adapted for removing part of solvent 155 in the material 108 prior to the lamination. While some solvent 155 in material 108 may be advantageous for the manufacturing process, an excessive amount of solvent 155 in the material 108 may be a cause for reliability and performance issues of component carrier 100 and may promote undesired warpage. An amount of solvent 155 may be removed out of the material 108 during lamination. A remaining excess of solvent 155 in the readily manufactured component carrier 100 may thereby deteriorate its properties in terms of reliability and performance, and may cause issues such as delamination and warpage. Advantageously, the material 108 may be pre-treated (for instance by pre-baking at a temperature below a lamination temperature) according to an exemplary embodiment prior to lamination with the stack 102 in a way that excessive solvent 155 is removed from the material 108 without fully curing the material 108 during the pre-treatment. Without wishing to be bound to a specific theory, a purpose may be to keep the temperature during pre-baking below the glass-transition temperature of the involved resin 153. Thereby, cross-linking of the resin 153 (as an example for curing) is limited and the resin 153 may be unable to fully cure during the pre-treatment.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a stack comprising at least one electrically conductive layer structure and at least one electrically insulating layer structure;
   wherein at least part of the at least one electrically insulating layer structure comprises or consists of a first material having a curing shrinkage value of less than 2%,
   wherein the stack comprises a core which comprises a second material having a coefficient of thermal expansion value below 15 ppm/K,
   wherein said first material has a value of the Young modulus above 8 GPa,
   wherein the first material and the second material are in direct physical contact with each other and wherein no copper traces are arranged between the first material and the second material.

2. The component carrier according to claim 1, comprising at least one of the following features:
   wherein the curing shrinkage value of the first material is less than 1%;
   wherein said first material is functionalized;
   wherein said first material forms an outer layer of the stack;
   wherein the at least one electrically conductive layer structure comprises a pad connected to a plated via, and wherein a ratio between a diameter of the pad and a maximum diameter of the plated via is less than 2;
   wherein the at least one electrically conductive layer structure comprises a landless plated via.

3. The component carrier according to claim 1, further comprising:
   a component embedded in the stack.

4. The component carrier according to claim 3, comprising at least one of the following features:
   wherein said first material directly covers at least part of the component;
   wherein said first material has a shell surrounding at least part of the component and has two opposing layers sandwiching the component and the at least partially surrounding shell and extending laterally beyond all sidewalls of the component.

5. The component carrier according to claim 3, wherein at least part of said first material is spaced with regard to the component by another material.

6. The component carrier according to claim 5, comprising at least one of the following features:
   wherein said other material has a value of the Young modulus below 8 GPa;
   wherein said other material directly surrounds at least part of the component with physical contact;
   wherein the other material has a curing shrinkage value of more than 1%;
   wherein said first material forms two opposing layers of the stack with the component and said other material in between;
   wherein said other material has a shell surrounding at least part of the component and has one layer or two opposing layers extending laterally beyond all sidewalls of the component.

7. The component carrier according to claim 3, wherein a ratio between a length of the embedded component and a length of the component carrier is at least 30%.

8. The component carrier according to claim 1, wherein the at least one electrically insulating layer structure comprises another material having different physical properties than said first material and being in direct physical contact with said first material.

9. The component carrier according to claim 1, wherein the curing shrinkage value of said material is measured by:
   connecting a layer of said first material in an uncured condition and with an initial length "A" on a base;
   curing said layer;
   determining a length "a" of the cured layer in a cured condition of said first material; and
   calculating the curing shrinkage value as (A−a)/A.

10. The component carrier according to claim 1, comprising at least one of the following features:

wherein said first material comprises at least 50 weight percent filler particles, in relation to the overall weight of said first material;

wherein said first material comprises filler particles with an average diameter in a range from 0.25 µm to 1 µm.

11. The component carrier according to claim 1, wherein said first material comprises filler particles, wherein at least 80% of the filler particles has a diameter in a range from 0.2 µm to 4 µm.

12. The component carrier according to claim 1, wherein said first material comprises less than 10 weight percent resin, in relation to the overall weight of said first material.

13. The component carrier according to claim 1, wherein said first material comprises, in a cured state, less than 1 weight percent solvent, in relation to the overall weight of said first material.

14. The component carrier according to claim 1, wherein said first material is fiber-free.

15. The component carrier according to claim 1, comprising at least one of the following features:
  wherein the at least one electrically conductive layer structure comprises at least one of the group consisting of copper, aluminum, nickel, silver, gold, palladium, and tungsten, any of the mentioned materials being optionally coated with supra-conductive material such as graphene;
  wherein at least one of the at least one electrically insulating layer structure comprises at least one of the group consisting of resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
  wherein the component carrier is shaped as a plate;
  wherein the component carrier is configured as one of the group consisting of a printed circuit board, and a substrate;
  wherein the component carrier is configured as a laminate-type component carrier.

16. A method of manufacturing a component carrier, wherein the method comprises:
  providing a stack comprising at least one electrically conductive layer structure and at least one electrically insulating layer structure; and
  providing at least part of the at least one electrically insulating layer structure of a first material having a curing shrinkage value of less than 2%,
  wherein the stack comprises a core which comprises a second material having a coefficient of thermal expansion value below 15 ppm/K,
  wherein said first material has a value of the Young modulus above 8 GPa,
  wherein the first material and the second material are in direct physical contact with each other and wherein no copper traces are arranged between the first material and the second material.

17. The method according to claim 16, wherein the method comprises reducing an amount of solvent of said first material before the laminating up to less than 1 weight percent, in relation to the overall weight of said first material.

18. The method according to claim 17, wherein the method comprises further reducing the amount of solvent of said first material by the laminating up to less than 0.15 weight percent, in relation to the overall weight of said first material.

19. The method according to claim 17, wherein an amount of solvent of said first material is initially at least 5 weight percent before changing said amount by reducing.

20. The method according to claim 16, wherein an amount of solvent of said first material is initially at least 5 weight percent before changing said amount by laminating up to less than 0.15 weight percent, in relation to the overall weight of said first material.

* * * * *